(12) United States Patent
Yellin et al.

(10) Patent No.: US 7,243,295 B2
(45) Date of Patent: Jul. 10, 2007

(54) LOW COMPLEXITY CHANNEL DECODERS

(75) Inventors: Daniel Yellin, Raanana (IL); Doron Rainish, Ramat-Gan (IL)

(73) Assignee: Intel Corporation, Santa Clara, CA (US)

(*) Notice: Subject to any disclaimer, the term of this patent is extended or adjusted under 35 U.S.C. 154(b) by 885 days.

(21) Appl. No.: 09/880,707

(22) Filed: Jun. 12, 2001

(65) Prior Publication Data
US 2002/0194567 A1 Dec. 19, 2002

(51) Int. Cl.
*H03M 13/03* (2006.01)
*H03M 13/00* (2006.01)
(52) U.S. Cl. .................... 714/794; 714/795; 714/759
(58) Field of Classification Search ............... 714/794, 714/795, 759
See application file for complete search history.

(56) References Cited

U.S. PATENT DOCUMENTS

| | | | |
|---|---|---|---|
| 4,393,276 A * | 7/1983 | Steele | 380/28 |
| 4,558,350 A | 12/1985 | Murakami | |
| 5,191,548 A | 3/1993 | Balkanski et al. | |
| 5,297,170 A | 3/1994 | Eyuboglu et al. | |
| 5,319,707 A | 6/1994 | Wasilewski et al. | |
| 5,381,425 A | 1/1995 | Bitzer et al. | |
| 5,563,660 A | 10/1996 | Tsukagoshi | |
| 5,974,181 A | 10/1999 | Prieto | |
| 5,983,384 A * | 11/1999 | Ross | 714/755 |
| 6,009,552 A | 12/1999 | Ariel et al. | |
| 6,029,264 A * | 2/2000 | Kobayashi et al. | 714/755 |
| 6,253,185 B1 * | 6/2001 | Arean et al. | 704/500 |
| 6,393,072 B1 * | 5/2002 | Ross et al. | 375/340 |
| 6,516,437 B1 * | 2/2003 | Van Stralen et al. | 714/755 |
| 6,516,444 B1 * | 2/2003 | Maru | 714/795 |
| 6,725,409 B1 * | 4/2004 | Wolf | 714/755 |
| 2004/0199856 A1 | 10/2004 | Yellin et al. | |

FOREIGN PATENT DOCUMENTS

CN 1286533 3/2001

OTHER PUBLICATIONS

Gerard J. M. Smit, Paul M. Heysters, Paul J. M. Havinga, Lodewijk T. Smit, Jaap Smit, and John Dilessen, Mapping the SISO module of the turbo decoder to a FPFA, In Proceedings of Second international symposium on Mobile Multimedia Systems & Applications (M.*
Engling Yeo, Payam Pakzad, Borivoje Nikolic and Venkat Anantharam, VLSI Architectures for Iterative Decoders in Magnetic Recording Channels, IEEE Transactions On Magnetics, vol. 37, No. 2, Mar. 2001.*
Benedetto et al., "Serial Concatenation of Interleaved Codes: Performance Analysis, Design, and Interactive Decoding", IEEE Transactions On Information Theory, vol. 44, No. 3, May 1998, pp. 909-926.
Berrou, "Near Optimum Error Correcting Coding And Decoding: Turbo-Codes", IEEE Tranactions On Communications, vol. 44, No. 10, Oct. 1996, pp. 1261-1271.

(Continued)

*Primary Examiner*—Joseph D. Torres
(74) *Attorney, Agent, or Firm*—Fish & Richardson P.C.

(57) ABSTRACT

A packet of encoded data is received and decoded using a look-up table that stores information approximating output of an algorithmic decoding process.

7 Claims, 4 Drawing Sheets

OTHER PUBLICATIONS

Berrou et al., "Near Shannon Limit Error - Correcting Coding and Decoding: Turbo-Codes (1)", ICC'93, Geneva, Switzerland, May 1993, pp. 1064-1070.

Hsu C-P et al., "A soft decision syndrome decoding algorithm for convultional codes." IEEE Milcom 1990, vol. 1, Sep. 30, 1990, pp. 375-379.

Tajima, M. "On the Structure of an SST Viterbi Decoder for General Rate (n-1)/n Convolutional Codes Viewed in the Light of Syndrome Decoding," IEICE Trans. Fundementals, E79-A (9): 1447-1449, 1996.

Açikel, Ö., "Implementation Issues for High Rate Turbo Codes on BPSK/QPSK Channels", *IEEE Global Telecommunications Conference-Globecom'99*, vol. 1A. pp. 148-152, (1999).

Bahl, L.R., et al., "Optimal Decoding of Linear Codes for Minimizing Symbol Error Rate",*IEEE Trans. Inform. Theory*, pp. 248-287, Mar. 1974.

Bayazit, U., et al., "Improving the Performance of Optimal Joint Decoding", *IEEE Proc. International Conference on Image Processing*, vol. 1, pp. 113-116, (1995).

Fischer, T., et al., "Trellis-coded Vector Quantization", *IEEE Transactions on Information Theory*, 37(6):1551-1566, Nov. 1991.

Forney, G.D., "The Viterbi Algorithm", *Proc. IEEE*, 61(3):268-278, Mar. 1973.

Park, G., et al., "A Block-wise MAP Decoder Using a Probability Ratio for Branch Metrics", *IEEE VTC '99*, vol.3 pp. 1610-1614, (1999).

\* cited by examiner

US 7,243,295 B2

LOW COMPLEXITY CHANNEL DECODERS

BACKGROUND

This invention relates to channel decoders.

In many of today's advanced communication systems, channel coding is a key ingredient. The transmitter partition's the data stream into blocks of bits (packets) that are encoded to introduce redundancy information into the transmitted block. The encoded data block is modulated and transmitted through the communication link (channel) connecting the transmitter to the receiver, and a channel-corrupted version of the transmitted data block is received at the receiver-end. After down-conversion and demodulation, the channel decoder at the receiver uses the redundancy introduced by the encoder to recover the transmitted information more reliably.

In general, channel decoders are often categorized by the combination of input/output values they accept or provide. For example, a hard-input hard-output (HIHO) decoder accepts a stream of bits (binary values) as input and provides a stream of binary bits at its output that represent the estimated transmitted bit sequence. Soft-input hard-output (SIHO) decoders accept as input real-valued levels called soft symbols or soft bits that represent the reliability of the bit value. A SIHO decoder produces a stream of binary bits at its output that represents the estimated transmitted bit sequence.

Turbo codes are a special case of channel coding that can operate very close to the theoretical limits of channel capacity and, therefore, are close to optimal. See, for example, C. Berrou et al., *Near Optimum Error Correcting Coding and Decoding: Turbo Codes,* 44 IEEE Transaction on Communications 1261 (1996), which addresses parallel concatenated turbo codes and their associated encoders and decoders. Serial concatenated turbo codes are addressed, for example, in S. Benedetto et al., "Serial Concatenation of Interleaved Codes: Performance Analysis, Design and Iterative Decoding," IEEE *Transaction on Information Theory,* vol. 44, No. 3, pp. 909–926, May 1998.

Turbo codes typically use another type of decoder, known as soft-input soft-output (SISO) decoder, that not only accepts soft inputs, but also provides soft-output. Thus, in SISO decoders, the reliability of the estimated bits, as well as the estimated bits, is provided. Some SISO decoders use the Bahl, Cocke, Jeinek and Raviv (BCJR) algorithm or the soft-output Viterbi algorithm (SOVA). See L. R. Bahl et al., *Optimal Decoding of Linear Codes for Minimizing Symbol Error Rate,* IT-20 IEEE Trans. Inform. Theory 248 (1974); G. D. Forney, The Viterbi Algorithm, 61 Proc. IEEE 268 (1973).

DETAILED DESCRIPTION

Figure 1:
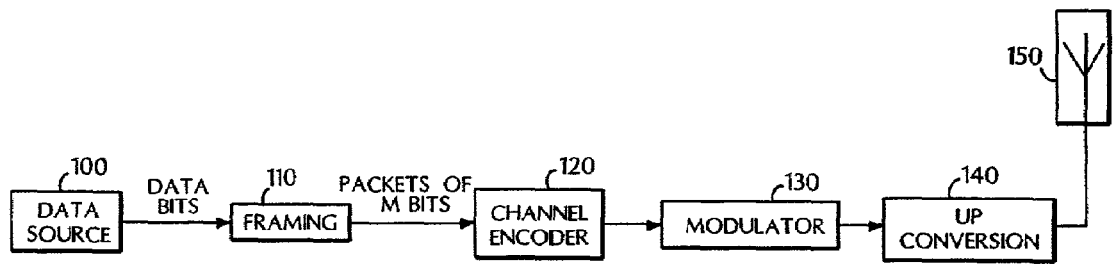
FIG. 1 shows a simplified transmitter structure for transmitting data in a communications systems.

As shown in FIG. 1, a transmitter includes a data source 100 that produces a bit stream to be transmitted. Framing block 110 partitions the bit streams into packets of M bits that are encoded by channel encoder 120. The encoded bits/packets are modulated by a modulator 130 and are up-converted by an up-conversion element 140 and transmitted through the transmitter's antenna 150.

Figure 2:
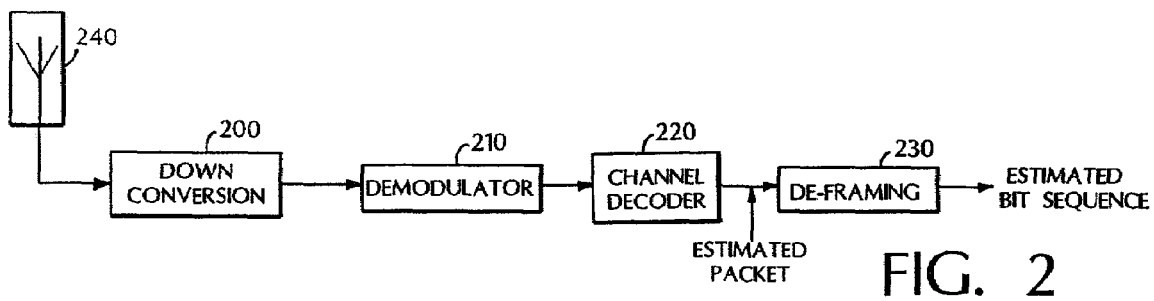
FIG. 2 shows a simplified receiver structure for receiving data in a communications systems.

As shown in FIG. 2, a receiver includes an antenna 240 that receives encoded data packets from the transmitter. The encoded packet is down-converted by a down conversion element 200 and demodulated by a demodulator 210. The demodulated packet is provided to a channel decoder 220 to recover the transmitted package. The sequence of recovered packages is converted to an estimated bit stream by a deframing device 230.

Figure 3:
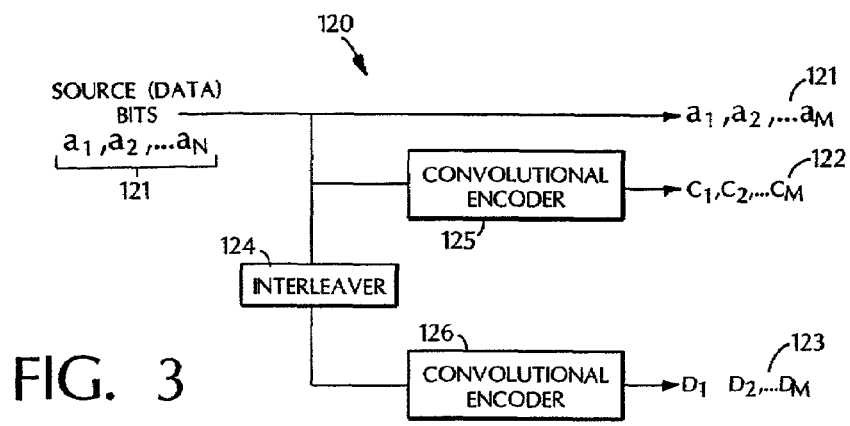
FIG. 3 is a block diagram of a parallel concatenated rate ⅓ turbo encoder.

FIG. 3 illustrates a rate ⅓ parallel concatenated turbo encoder as an example of the channel encoder 120. The packet data, a1, a2, ..., aM (121) represents a sequence of M bits to be encoded. The output of the encoder includes the data bits a1, a2, ..., aM (121), a set of redundancy bits c1, c2, ..., cM (122) that are the output of a first convolutional encoder 125, and a second set of redundancy bits d1, d2, ..., dM (123) that are the output of a second convolutional encoder 126 that operates on re-ordered input bits obtained from an interleaver 124.

Figure 4:
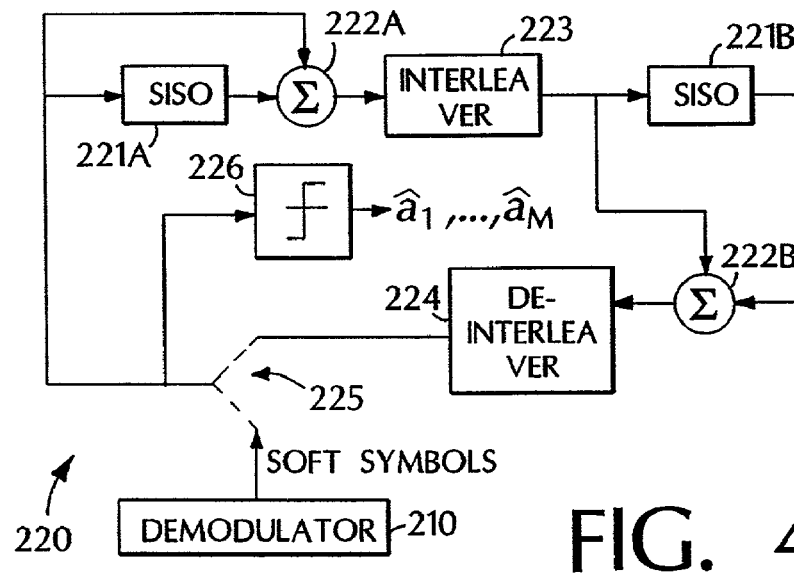
FIG. 4 is a block diagram of a parallel concatenated rate ⅓ turbo decoder.

FIG. 4 illustrates a channel decoder 220 for decoding data packets encoded by the encoder 120 of FIG. 3. Soft values from the demodulator 210 are passed through a switch 225 to a first SISO decoder 221A. The soft decoder outputs are passed into a summer 222A where the soft inputs to the first SISO decoder are subtracted. Thus, the summer 222A arithmetically combines the output from the SISO decoder 221A and the soft input values. The outputs of the summer 222 are considered extrinsic information. The extrinsic information is interleaved by interleaver 223 and fed into a second SISO decoder 221B. Extrinsic information is generated at the output of a summer 222B and is deinterleaved by the de-interleaver 224 and passed through the switch 225 as input to the fist SISO decoder 221A. The process continues in an iterative manner, until a termination criterion is satisfied. The values output from the SISO 221B then are passed through a decision device such as a slicer 226 that provides the final estimate of the transmitted bits, $\hat{a}_1, \hat{a}_2, \ldots, \hat{a}_M$.

Figure 5:
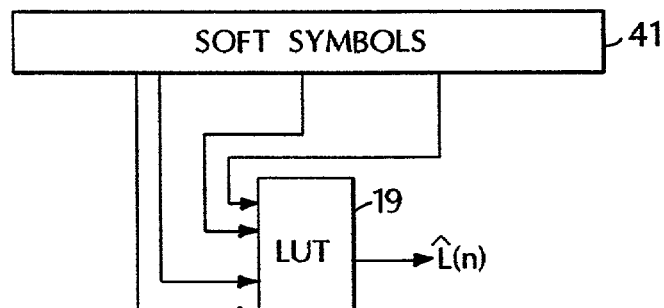
FIG. 5 is a diagram illustrating soft-input soft-output decoding through a look-up table.
Figure 6:
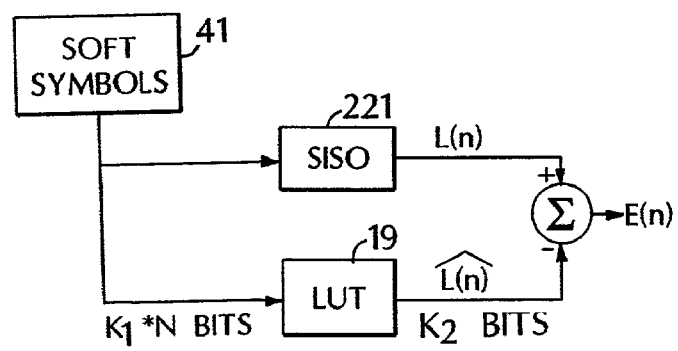
FIG. 6 is a diagram illustrating preparation of the look-up table.

As illustrated in FIG. 5, one or both of the SISO decoders 221A, 221B can be replaced by a look-up table (LUT) 19 that is pre-configured to approximate the output of an algorithmic SISO decoding process. A pre-configuration process is shown in FIG. 6. The contents of the LUT 19 are determined by generating a $2^{(N*K_1)}$ entry table, with each entry having $K_2$ bits. The table entries are chosen so that the table's output in response to a given set of N soft symbols (each consisting of $K_1$ bits) corresponds to an approximation of the output of a pre-specified conventional SISO decoder 221 operating on a block of M symbols, where M is greater than N−1. The approximation can be based, for example, on the mean square of the error term E(n), or on some other pre-specified criteria. If the optimization criterion is minimizing the mean square error between the LUT and actual SISO decoder outputs, then the entries to the LUT 19 should be adjusted to minimize the sum of errors squared:

$$\sum_{n=1}^{M} |E(n)|^2.$$

An alternative LUT pre-configuration criterion can be the overall probability of error of the decoder that utilizes the LUT. In that case, the entries of the table are chosen to minimize the overall error probability of the resulting decoder.

The parameters N, $K_1$ and $K_2$ are user-defined parameters that may depend on the coding scheme, signal-to-noise ratio (SNR), anticipated channel conditions, and on the value of M.

As shown by FIG. 5, when a sequence of soft symbols 41 is received, the corresponding output soft symbol is found in the LUT 19. The $n^{th}$ soft output is obtained by feeding the soft symbols $n-n_1, n-n_{1+1}, \ldots, n-1, n, n+1, \ldots, n-n_1+N-1$, to the look-up table and reading the corresponding $K_2$ bit table entry. The parameter $n_1$ also is a design parameter.

To reduce the number of entries in the table, joint quantization of several symbols can be performed, thereby allowing the decoder 220 to operate on soft multi-symbols requiring fewer bits. This can significantly reduce the number of bits required at the input to the LUT 19 and, therefore, significantly reduce the number of its entries. When implemented for turbo decoders, this also can reduce the overall memory requirements of the decoder because joint quantization of multiple symbols is more economical in terms of storage requirements than individual single-symbol scalar quantization of each symbol (bit).

Figure 7:
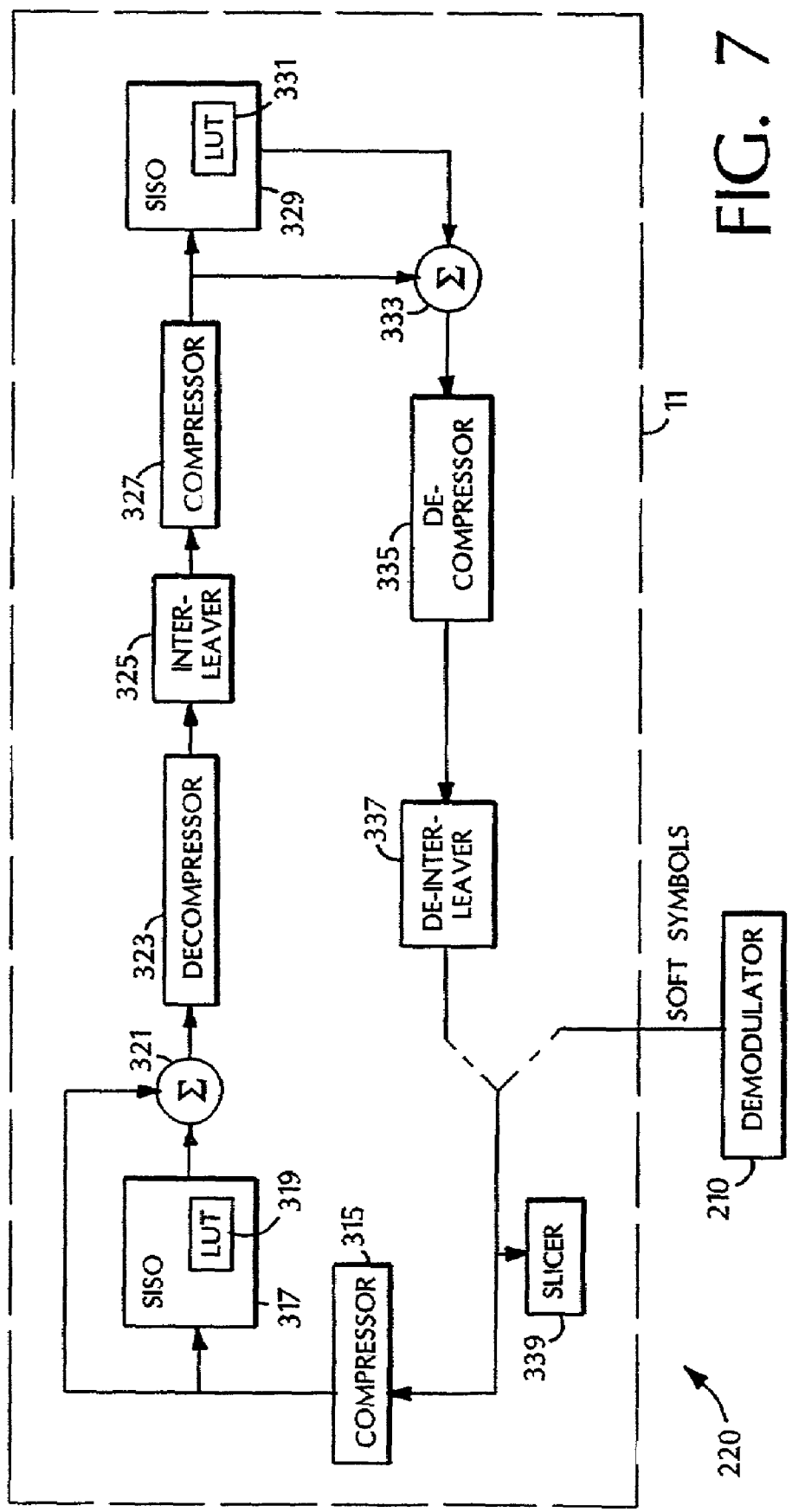
FIG. 7 is a block diagram of another implementation of a parallel concatenated turbo decoder.

FIG. 7 illustrates a rate ⅓ parallel concatenated turbo decoder 220 that uses both joint quantization and LUT SISO decoding. As shown in FIG. 7, the decoder 220 receives a vector of soft symbols from the demodulator 210. A compressor 315 jointly quantizes P adjacent soft symbols that then are decoded by a soft-input soft-output (SISO) decoder block 317 that can include a look-up table (LUT) 319 that is pre-configured to approximate the output of a SISO decoder that operates jointly on P soft symbols. The pre-configuration process is explained below.

The soft outputs of the SISO decoder 317 are passed through a summer 321 where the soft inputs are subtracted to generate extrinsic information. The extrinsic information is decompressed into the single-symbol (bit) level by a decompressor 323 and interleaved by the interleaver 325.

Next, the soft symbols are re-compressed by a compressor 327 that functions in a similar manner as the first compressor 315. The compressed symbols are processed by a second SISO decoder block 329 that also can use a LUT 331 to decode the symbols. The SISO block 329 and its LUT 331 can be identical to or substantially the same as the first SISO block 317 and LUT 319. The resulting soft symbols are used to generate extrinsic information at the output of another summer 333. The extrinsic information is decompressed to the bit level by decompressor 335 and de-interleaved by de-interleaver 337. The decompressor 335 may be identical to or substantially the same as decompressor 323.

The process continues in an iterative manner for a pre-determined number of iterations of the decoding process, or until some other termination criterion is reached. A slicer 339 then converts the soft symbols to bits to provide the estimated transmitted information sequence $\hat{a}_1, \hat{a}_2, \ldots, \hat{a}_M$.

As explained above, to reduce the number of entries in the tables 319, 331, joint quantization of P symbols can be performed to allow the decoder to operate on soft multi-symbols that require fewer bits to represent each multi-symbol compared to the P*K1 that may be required in the scalar single-symbol quantizer approach. This can significantly reduce the number of bits required at the input to the look-up tables 319, 331 and can significantly reduce the number of the entries in the tables. In the context of turbo decoding, it also can reduce the storage requirements because fewer than M*k1 bits are required to represent each block of M soft symbols. For a rate ⅓ turbo code, at least three such blocks would be stored.

Figure 8:
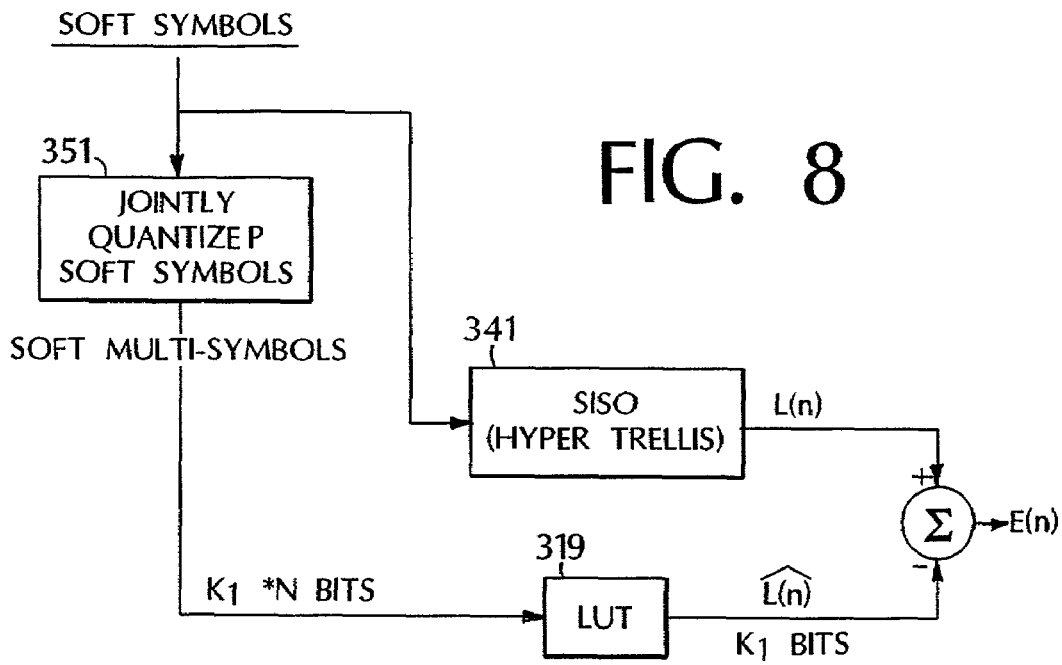
FIGS. 8 and 9 are diagrams illustrating preparation of a look-up table with multi-symbol quantization.

As shown in FIG. 8, the SISO decoder 341 that is used as a reference for adapting the look-up table 319 (or 331) can be fed with the soft symbols without quantizing them. The LUT 319 would receive soft multi-symbols as input. A multi-symbol quantizer 351 also can be used to implement a look-up table adapted for use in the decoder, thereby optimizing both the quantizer 351 and LUT 319. Alternatively, the SISO decoder 341 can be fed with the quantized multi-symbols and adaptation of the LUT can be performed as described above.

The compressors 315 and 327 can be identical to or substantially the same as the joint quantizer 351, and the decompressors 323 and 335 can implement the inverse operation.

Figure 9:
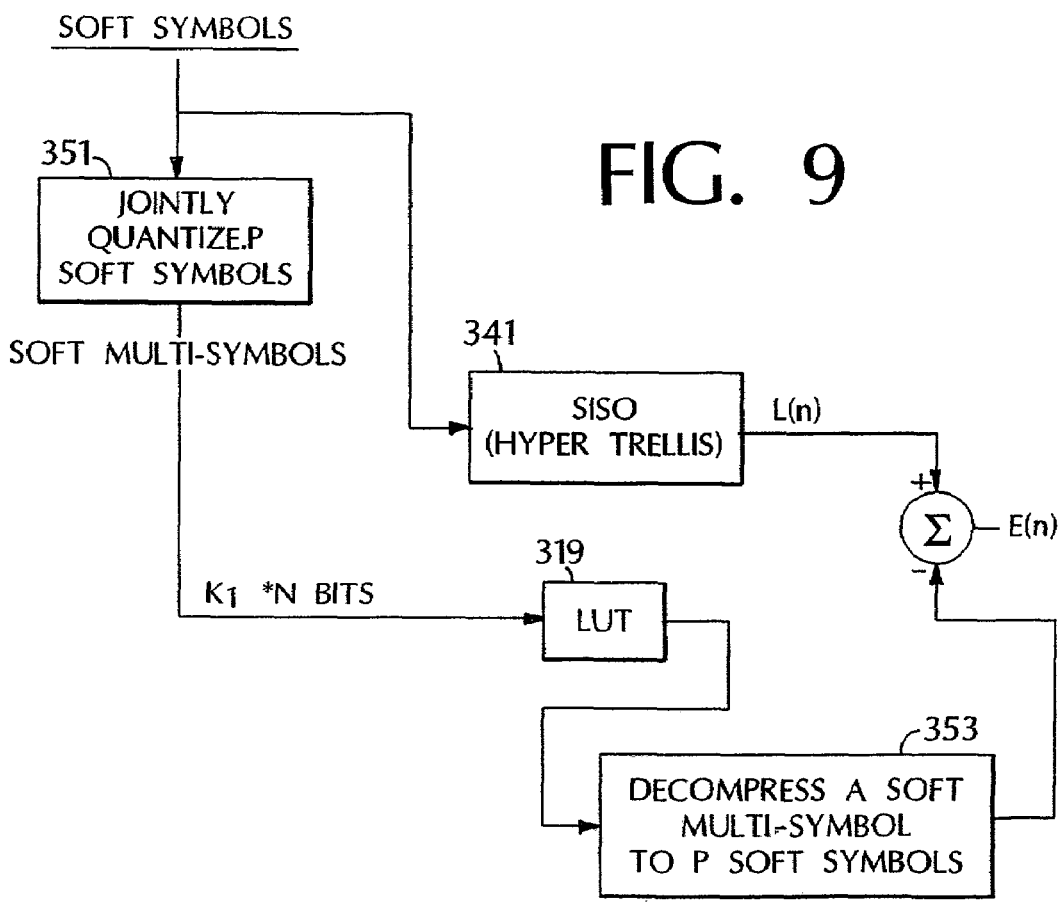

As shown in FIG. 9, the multi-symbol quantizer 351 and the inverse operation of decomposing the multi-symbol soft from the LUT-based SISO decoder 319 into P multiple soft symbols can be pre-configured jointly by a decompressor block 353. The joint quantizer 351 and the decompressor 353 also can be implemented by a look-up table and can be pre-configured to minimize the error term E(n) or to minimize the overall probability of error.

The decompressors 323 and 335 can be identical to or substantially similar to the pre-configured multi-symbol decompressor 353.

The foregoing techniques using look-up tables to implement the SISO block(s) can be used for other channel decoders, for example, for serially concatenated turbo decoders or for other non-turbo channel decoders. The techniques can be used for SIHO, HIHO and HISO decoders.

Using a look-up table that approximates output of the algorithmic decoding process can help reduce the cost and complexity of channel decoders.

Similarly, the joint quantization approach with compress/decompress stages can be performed without the SISO being replaced by look-up tables, for example, to reduce memory requirements in turbo codes.

Although the techniques have been described above in the context of processing turbo codes, a look-up table can be used to replace a conventional SISO decoder in other contexts as well, such as the BCJR algorithm and the soft-output Viterbi algorithm (SOVA). Soft-input hard-output (SIHO) decoders such as those used in the Viterbi algorithm also can be implemented with this approach, as well as hard-input hard-output (HIHO) decoders. In addition, partial implementation of any of these decoders using a LUT also can be used. For example, the forward iteration of the BCJR algorithm can be implemented in a conventional manner while the backward iteration may be implemented with a LUT.

Various features of the system can be implemented in hardware, software, or a combination of hardware and software. For example, some features of the system can be implemented in computer programs executing on programmable computers. Each program can be implemented in a high level procedural or object-oriented programming language to communicate with a computer system. Furthermore, each such computer program can be stored on a storage medium, such as read-only-memory (ROM) readable by a general or special purpose programmable computer or processor, for configuring and operating the computer when the storage medium is read by the computer to perform the function described above.

Other implementations are within the scope of the following claims.

What is claimed is:

1. A method for decoding channel-encoded date comprising:
   (a) receiving encoded symbols;
   (b) compressing the encoded symbols to obtain compressed symbols;
   (c) decoding the compressed symbols using a first look-up table that stores information approximating output of an algorithmic decoding process to obtain decoded symbols;
   (d) arithmetically combining the compressed symbols with the decoded symbols to obtain a first result;
   (e) decompressing the first result to obtain a decompressed first result
   (f) interleaving the decompressed first result to obtain an interleaved first result;
   (g) compressing the interleaved first result to obtain a compressed, interleaved first result;
   (h) decoding the compressed, interleaved first result using a second look-up table that stores information approximating output of an algorithmic decoding process to obtain a decoded first result
   (i) arithmetically combining the decoded first result with the compressed, interleaved first result to obtain a second result;
   (j) decompressing the second result to obtain a decompressed second result; and
   (k) de-interleaving the decompressed second result.

2. The method of claim 1 including:
   repeating (b) through (k) until a predetermined criterion is satisfied; and
   determining information bits corresponding to the encoded symbols received in (a).

3. An apparatus for decoding channel-encoded data comprising:
   memory storing a first look-up table with information approximating output of a first algorithmic decoding process and a second look-up table with information approximating output of a second algorithmic decoding process; and
   a processor configured to
   (a) compress a packet of received encoded symbols to obtain compressed symbols;
   (b) decode the compressed symbols using the first look-up table to obtain decoded symbols;
   (c) arithmetically combine the compressed symbols with the decoded symbols to obtain a first result;
   (d) decompress the first result to obtain a decompressed first result
   (e) interleave the decompressed first result to obtain an interleaved first result:
   (f) compress the interleaved first result to obtain a compressed, interleaved first result;
   (g) decode the compressed, interleaved first result using the second look-up table to obtain a decoded first result;
   (h) arithmetically combine the decoded first result with the compressed, interleaved first result to obtain a second result;
   (i) decompress the second result to obtain a decompressed second result; and
   (j) de-interleave the decompressed second result.

4. The apparatus of claim 3 wherein the processor is configured to:
   repeat (a) through (j) until a predetermined criterion is satisfied; and
   determine information bits corresponding to the encoded symbols.

5. An article comprising a computer-readable medium that stores computer-executable instructions for causing a computer system, in response to receiving a channel-encoded data packet, to:
   (a) compress a packet of received encoded symbols to obtain compressed symbols;
   (b) decode the compressed symbols using a first look-up table approximating output of an algorithmic decoding process to obtain decoded symbols;
   (c) arithmetically combine the compressed symbols with the decoded symbols to obtain a first result;
   (d) decompress the first result to obtain a decompressed first result
   (e) interleave the decompressed first result to obtain an interleaved first result;
   (f) compress the interleaved first result to obtain a compressed, interleaved first result;
   (g) decode the compressed, interleaved first result using a second look-up table approximating output of an algorithmic decoding process to obtain a decoded first result;
   (h) arithmetically combine the decoded first result with the compressed, interleaved first result to obtain a second result;
   (i) decompress the second result; and
   (j) de-interleave the decompressed second result.

6. The article of claim 5 including instructions for causing the computer system to:
   repeat (a) through (j) until a predetermined criterion is satisfied; and
   determine information bits corresponding to the encoded symbols.

7. The article of claim 5 including instructions for causing the computer system to decode the compressed symbols using a first look-up table approximating output of a soft-input soft-output algorithmic decoding process, a soft-input hard-output algorithmic decoding process, a hard-input soft-output algorithmic decoding process, or a hard-input hard-output algorithmic decoding process.

* * * * *